United States Patent [19]

Aoyama et al.

[11] Patent Number: 4,659,938
[45] Date of Patent: Apr. 21, 1987

[54] SYSTEM FOR GENERATING HOLE DIAMETER INFORMATION OF PRINTED BOARD AND THE LIKE

[75] Inventors: Yoshiyuki Aoyama; Shuitsu Funabashi; Masaaki Matsuzaka, all of Fujisawa, Japan

[73] Assignee: Nippon Seiko Kabushiki Kaisha, Tokyo, Japan

[21] Appl. No.: 654,384

[22] Filed: Sep. 25, 1984

[30] Foreign Application Priority Data

Sep. 27, 1983 [JP] Japan ................. 58-178951

[51] Int. Cl.⁴ .............................................. G06K 7/10
[52] U.S. Cl. .................................. 250/566; 250/226
[58] Field of Search ................ 250/226, 566, 568; 235/469; 356/402

[56] References Cited

U.S. PATENT DOCUMENTS

| | | | |
|---|---|---|---|
| 2,760,404 | 8/1956 | King | 235/469 |
| 3,890,048 | 6/1975 | Abbondio | 250/226 |
| 3,894,217 | 7/1975 | Ebukuro | 250/566 |
| 3,945,729 | 3/1976 | Rosen | 250/226 |
| 4,494,875 | 1/1985 | Schramm | 250/226 |

Primary Examiner—David C. Nelms
Assistant Examiner—William L. Oen
Attorney, Agent, or Firm—Basile, Weintraub & Hanlon

[57] ABSTRACT

Hole diameter information is represented by color information. After detecting the color information, the detected color information is converted and generated into the hole diameter information. In this manner, a plurality of kinds of hole diameter information can be processed simultaneously, and efficiently with error reduction. The invention disclosed includes a pattern figure (2a) having a plurality of marks corresponding to holing positions of a printed board or the like and indicated by identification colors (3) corresponding to hole diameters of the holing positions. A detecting device 4 for generating detection signals corrsponding to the identification colors (2) of the marks in the pattern figure (2a), and hole diameter information generating means (6) for generating information representing the hole diameters by deciding the identification colors.

6 Claims, 4 Drawing Figures

SYSTEM FOR GENERATING HOLE DIAMETER INFORMATION OF PRINTED BOARD AND THE LIKE

BACKGROUND OF THE INVENTION

1. Field of the Invention

The present invention relates to a system for generating hole diameter information for a printed board or printed circuit board and the like. In particular, the present invention relates to a system for generating hole diameter information for a printed board and the like, which is capable of reading hole diameter information from a pattern figure corresponding to a pattern for a printed board.

2. Description of the Prior Art

Printed boards are now widely used in various products ranging from household electric and electronic appliances to computers.

On the printed boards used for these products, various wiring patterns are drawn, and electric and electronic components which are incorporated therein are connected through lead lines and a desired circuit is formed. In this instance, the lead lines are in many cases, inserted into holes or openings, provided in the printed board and connected to the wiring pattern on the printed board by soldering or the like.

The holes in which the lead lines are inserted have various diameters depending on the types or shapes of the electric and electronic components to be mounted therein. Generally, these holes are formed by an NC machine tool, and their holing positions, hole diameters, number of holes, etc., are prepared as NC tape information in the form of coordinate information; such information indicating numerical values of the diameters, and the like.

Each of the holing positions can be read from a pattern figure corresponding to a pattern on the printed board, for example, from a negative film of the pattern by using a hole position reading device. However, as regards the hole diameters which are usually about 0.8 to about 10 mm, when the diameters are directly read as numeric information, there is a possibility of an errogenous reading. For this reason, from the standpoint of reliability, rather than reading the hole diameters directly, or together with the reading of the hole diameters, in many cases, the hole diameters are set and the hole position, corresponding to the set hole diameters, are read individually to obtain the hole positions corresponding to the hole diameters.

Thus, where the holes are formed, depending on the individual hole diameters, a directive figure, which coincides with the pattern of the printed board is used. Marks are, then, provided which are respectively, different from one another, depending on the hole diameters, and are assigned in the directive figure. Holes corresponding to desired hole diameters are individually read by discriminating the hole diameters. Alternatively, hole diameters to be selected are discriminated by colors from other hole diameters, and holes corresponding to desired hole diameters are read individually.

Recently, however, as the number and kinds of holes in the printed board increase and as the electric and electronic components become smaller and more complicated, and are formed with higher density, the holes provided in the printed board have further increased in number and density, and the different kinds of the holes have also increased. Thus, in such conventional systems described in the foregoing, there are drawbacks in that an error in the directive figure or display of the hole diameters and an erroneous recognition, as well as an error in the read position tend to occur. Furthermore, a hole position reading procedure must be repeated for each kind of hole diameter. This results in problems of low working efficiency, and in addition thereto, of increased errors.

Prior art technical documents related to the present invention and known by the inventors of the present application include U.S. Pat. No. 3,293,439 which discloses a system for determining a holing position from coordinate information, and Japanese Patent Laid-Open (KOKAI) Publication No. 58-50408 (1983) disclosing a system for determining a holing position and a diameter thereof by detecting a color mark of a detection hole based on a difference in color sensitivity.

However, in the former, all the drawbacks in the conventional systems mentioned above are involved, and in the latter, the system is insufficient in its precision and reliability, and further the system is complicated and is economically inefficient.

SUMMARY OF THE INVENTION

The invention has been developed in view of the drawbacks and problems in the prior art. Thus, it is an object of the present invention to provide a system for generating hole diameter information for a printed board and the like in which the drawbacks and problems in the prior art are eliminated, and wherein a plurality of kinds of hole diameters can be read accurately and efficiently with substantially no error.

In order to achieve the objects hereof, the characteristics of this invention reside in that hole diameter information is represented by color information, and after detecting the color information, the detected information is converted to generated hole diameter information. Owing to these characteristics, a plurality of kinds of hole diameter information is simultaneously processed to improve the efficiency of the system and to reduce any errors.

In accordance herewith, there is provided (a) a pattern figure having a plurality of marks provided corresponding to holing positions of a printed board and the like and which is indicated by indentification colors corresponding to hole diameters; (b) detecting means for generating detection signals corresponding to identification colors of said marks in said pattern figure, and (c) hole diameter information generating means responsive to the signals from the detecting means for generating information indicating hole diameters by determining the identification colors.

According to this invention, since the hole diameter information is represented by the color information, and the hole diameter information is detected by the color information detecting means, and since the detected color information is converted into the hole diameter information so that the resultant hole diameter information is generated, error in the directive figure or display of the hole diameters and in the recognition of the directive is minimized. Further, even if many kinds of hole diameters are involved, respective kinds of hole diameters can be read efficiently.

For a more complete understanding of the present invention, reference is made to the following detailed description and accompanying drawing. In the drawing like reference characters refer to like parts throughout the several views.

BRIEF DESCRIPTION OF THE DRAWINGS

FIG. 1 is a schematic diagram of a system for generating hole diameter information for a printed board and the like;

DETAILED DESCRIPTION OF THE PREFERRED EMBODIMENTS

Figure 1:
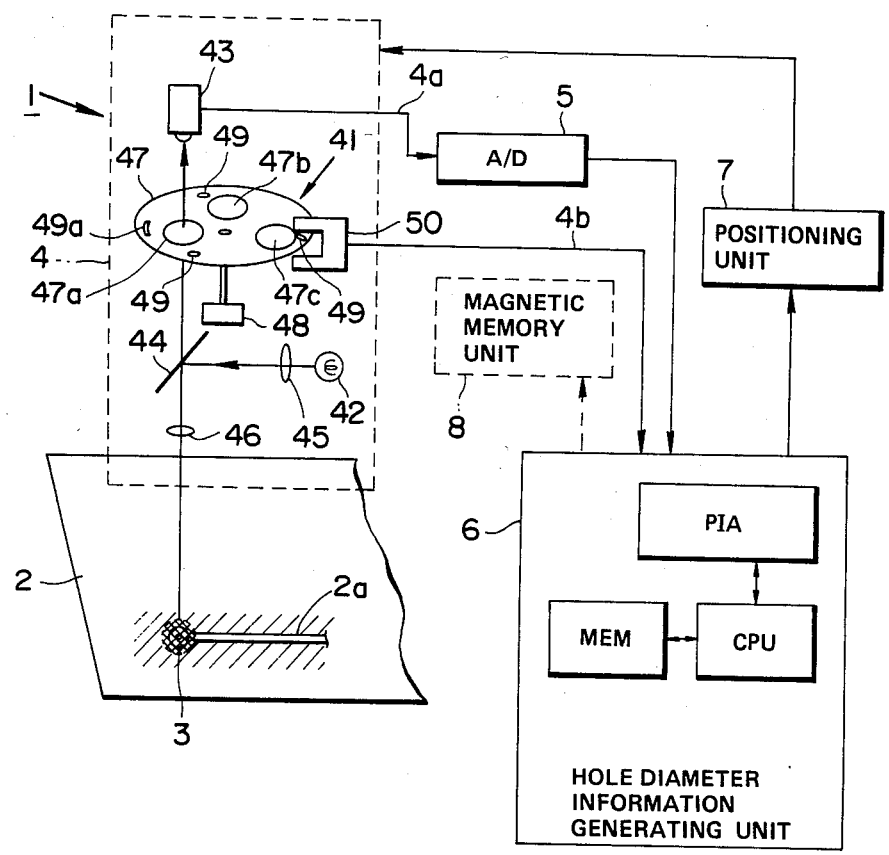

Hereinafter, embodiments of this invention will be explained in detail referring to the drawings.

Referring now to FIG. 1, there is provided a system for generating hole diameter information of a printed board and the like, generally, denoted by reference number 1. The system, also, includes a film 2 on which a printed pattern 2a, corresponding to a printed board, is drawn. On the film 2 there is provided an identification color mark 3 corresponding to a hole diameter, corresponding to a holing position of the printed board. For example, a circular figure coated with a red color or other color mark 3 is drawn on the printed pattern 2a.

As the color of the identification color mark 3, for example, red is assigned for a hole diameter of 0.8 mm, green for a hole diameter of 1.2 mm, and yellow for a hole diameter of 1.5 mm and so on. Thus, a separate color is assigned for a corresponding hole diameter.

A detecting device 4 is positioned above and corresponds to the position of the identification color mark 3 which is coated on the film 2 which, in turn, corresponds to a desired holing position. The detecting device 4 emits a light beam which impinges on the identification color mark 3. The device 4 receives reflected light and generates a detection signal containing color information 4a, corresponding to the color of the identification color mark 3.

The color information 4a generated consists of signal information 4a representing the amount of the reflected light and a second information 4b relating to a color filter then used. The signal information 4a relating to the amount of reflected light is obtained as analog data. The information 4b of the color filter is detected as digital data. The signal 4a relating to the amount of light is digitized by an A/D converter 5 and the resultant date is inputted to a hole diameter information generating unit 6. The signal information 4b relating to the color filter is directly inputted to the hole diameter information generating unit 6.

The hole diameter information generating device 6 is a preferably a microcomputer. The microcomputer is provided with an interface circuit (PIA), a processing unit (CPU), and a memory (MEM). Based on these signals, the microcomputer determined the color coated on the identification color mark 3 and refers to or looks up a hole diameter table stored in the memory (MEM) to convert a hole diameter corresponding to the color into hole diameter information.

Then, the hole diameter information is stored in the memory so that the hole diameter information is in a corresponding relationship to position information stored in the memory. Alternatively, the hole diameter information is, together with the position information, supplied to and stored in an external memory unit, such as, a magnetic memory unit 8 in order to prepare an NC tape. Further, the hole diameter information generating unit 6, by controlling a positioning mechanism 7, performs a control for positioning the detecting device 4 to a next desired hole position.

The detecting device 4 is provided with a color filter mechanism 41, a light source 42 (usually, a white color source); a photo detector 43 comprising, for example, a photo transister or the like; and a half mirror 44 or the like. A light beam emitted from the light source 42 is, through a lens 45, reflected by the half mirror 44. The reflected light, via a lens 46, illuminates the identification color mark 3 on the film 2. Then, the light beam reflected from the mark 3 is, through the lens 46, transmitted by the half mirror 44 therethrough and passes through a filter disk 47 of the color filter mechanism 41 to reach the photo detector 43, at which the light beam is received. As a result, an electric signal corresponding to the amount of reflected light is obtained from the photo detector 43.

In this instance, the reflected light, before being received, passes through one of the color filters on the filter disk 47, such as a red color filter 47a. On this filter disk 47, other than the red color filter 47a, a green color filter 47b and a blue color filter 47c are also provided. These color filters, 47a, 47b and 47c, respectively, correspond to the three primary colors of red, green and blue.

The filter disk 47 is rotatably driven at a predetermined speed by a motor 48. Positioning holes 49 are provided at the periphery of the disk. The holes 49 each, respectively, correspond to positions at which the color filters 47a, 47b and 47c respectively transmit the reflected light from the film 2. The holes 49 are detected by a position detector 50 defined by a photo interrupter or the like. Detection signals are supplied to the hole diameter information generating unit 6 as position signals of the respective color filters 47a, 47b and 47c. A hole 49a is provided on the filter disk 47 as a rotation reference position mark for the filter disk 47.

Figure 2:
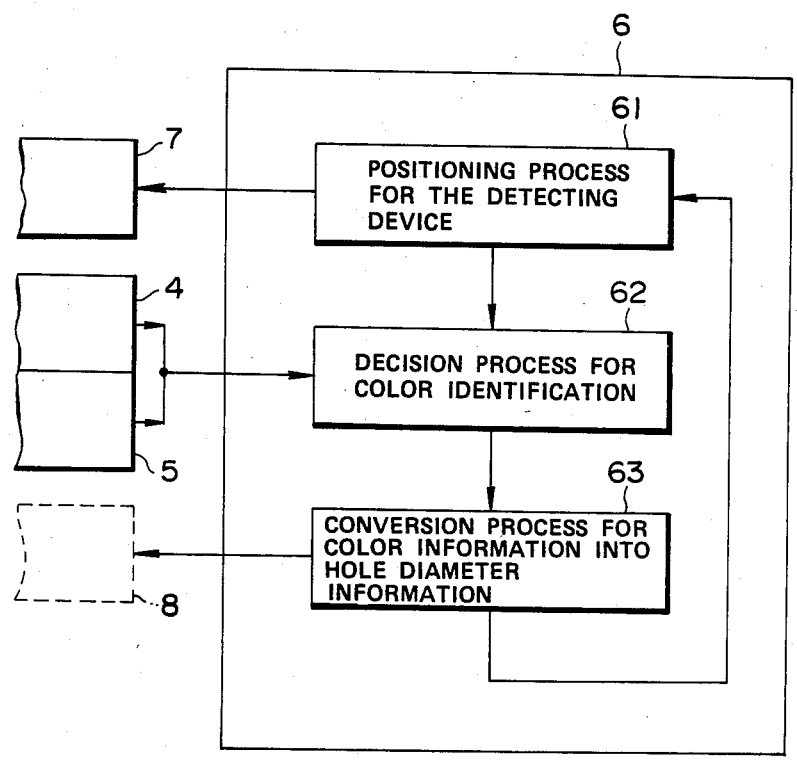
FIG. 2 is a block diagram showing the function of the hole diameter information generating system in FIG. 1.

Referring, now, to FIG. 2 there is shown in a block diagram a function diagram of the hole diameter information generating unit 6.

The hole diameter information generating unit 6 is provided with a positioning processing means 61 for positioning the detecting device 4, a decision processing means 62 for deciding color identification and a conversion processing means 63 for converting color information into hole diameter information.

In operation, the generating unit 6 works, as follows: first, in response to an actuation signal, the positioning processing means 61 for the detecting device 61 positions the detecting device 4 at a desired holing position (for example, Nth address position N: at first, from N=1) on the film 2, and, thus, positions the detecting device 4 above the identification color mark 3 which is coated with a color corresponding to the holing position having a predetermined hole diameter. At the completion of this positioning operation, the positioning processing means 61 for the detecting device supplies a positioning completion signal to the decision processing means 62. Upon receiving the positioning completion signal, the decision processing means 62 takes the detection signals from the detecting device 4 and the A/D converter 5, and determines the color of the identification color mark 3. As a result of this decision, corresponding color information is supplied to the conversion processing means 63 for color information-hole diameter information, and the conversion processing means 63, using the color information as a parameter, refers to a color information-hole diameter information table in the memory and obtains corresponding hole diameter information.

The hole diameter information thus obtained is supplied from the conversion processing means 63 and stored in the memory unit 8. Furthermore, in this case, corresponding hole position information (coordinate information of the hole position) is supplied, together with the hole diameter information, if necessary, and the position information is edited and recorded sequentially in correspondence to the hole diameter.

Next, after sending the hole diameter information, the conversion processing means 63 sends a positioning start signal to the positioning processing means 61 in order to position the detecting device 4 at the next holing position. Upon receiving the positioning start signal, the positioning processing means 61 for the detecting device updates the hole address, for example, making $N=N+1$, and positions the detecting device 4 at an Nth address (in this instance, $N=2$), which is the next desired holing position on the film 2.

After completion of the positioning, the positioning completion signal is again sent to the decision processing means 62.

In this manner, for all the preset holing positions, the hole diameter information can be obtained sequentially. The hole diameter information, without being sent to the magnetic memory unit 8 may be stored in a memory provided within the hole diameter information generating unit 6 in correspondence to the hole position information corresponding to the indentification color mark 3. Such a memory is, also, built into the positioning processing means 61 for the detecting device and each hole position information is stored in this memory in the form of a table. However, the aforementioned color-hole diameter conversion table, may also be stored together in this memory.

A processing procedure will be described in detail by reference to FIG. 3, in which the positioning processing means 61 for the detecting device, decision processing means 62 and conversion processing means 63 are achieved by programming the processing unit (CPU).

First, step ① is an initial condition setting and processing step, and a variable N is set to an initial value, $N=1$, and then, as a reference for color reading, a white identification color mark is read. This information is stored in the memory as the reference values of red, green and blue, corresponding to each color filter 47a, 47b and 47c.

Next, in step ②, the hole diameter information generating unit 6 reads a first hole position from the memory in accordance with the address $N=1$, and by controlling the positioning unit 7 positions the detecting device 4 at the first holing position on the film 2.

Then, in step ③, a signal is taken from the position detector 50, as a filter position signal, and the generating unit 6 decides whether it is a red filter position or not depending on the timing from the reference position (reference hole position 49a). When it is not the red filter position, the unit 6 then proceeds to a wait loop the red filter position. However, if the red filter position is decided, then, in step ④ a signal from the A/D converter ⑤ is read, and in step 5 the data is set to a variable R.

Next, in step ⑥, similarly, a signal from the position detector 50 is taken as the filter position signal, and it is decided whether it is a green filter position or not depending on the timing from the reference position (reference hole position 49a). If it is not the green filter position, then, the generating unit 6 proceeds to the wait loop to await the green filter position. When the green filter position has been obtained, in step ⑦ a signal from the A/D converter 5 is read, and in step ⑧ the data is set to a variable G. Similarly, in step ⑨, the blue filter position or not is decided, and if the blue filter position is obtained in step ⑩ data from the A/D converter 5 is read, and in step ⑪ this data is set to a variable B. It is assumed that the filter disk 47 is rotated in a direction so that the detection positions of the respective color filters appear in the order of red, green and blue.

Then, in step ⑫, based on the reference values of red, green and blue set in step ①, each value of the variable R, G and B is compared with each reference value, and respective ratios are calculated. In step ⑬, each of the calculated ratios is normalized or standardized so that each ratio is a ratio to a value in which each reference value is distributed in the ratio of 33.3 percent as a white mark to thereby obtain each color component which is normalized corresponding to red, green and blue.

The color components, as a normalized ratio value, Rn, Gn and Bn, thus obtained represent respectively corresponding colors. By obtaining these color components, each color can be decided.

Then, in step ⑭, the color-hole diameter conversion table is addressed by using the color components Rn, Gn and Bn as parameters to obtain hole diameter information corresponding to the detected color.

In step ⑮, the hole diameter value is outputted to the external memory unit or internal memory, and in step ⑯ the variable N of the address value indicating a hole diameter position is updated so that $N=N+1$, and returns to step ②.

As a result, in step ②, at this time, the detecting device 4 is positioned to the next hole diameter position $N=2$, and then a similar procedure is repeated, and the next hole diameter information is obtained.

In this manner, by sequentially detecting the identification color mark 3 is correspondence to each hole position, each hole diameter information can be generated, depending on its coated color.

Figure 3:
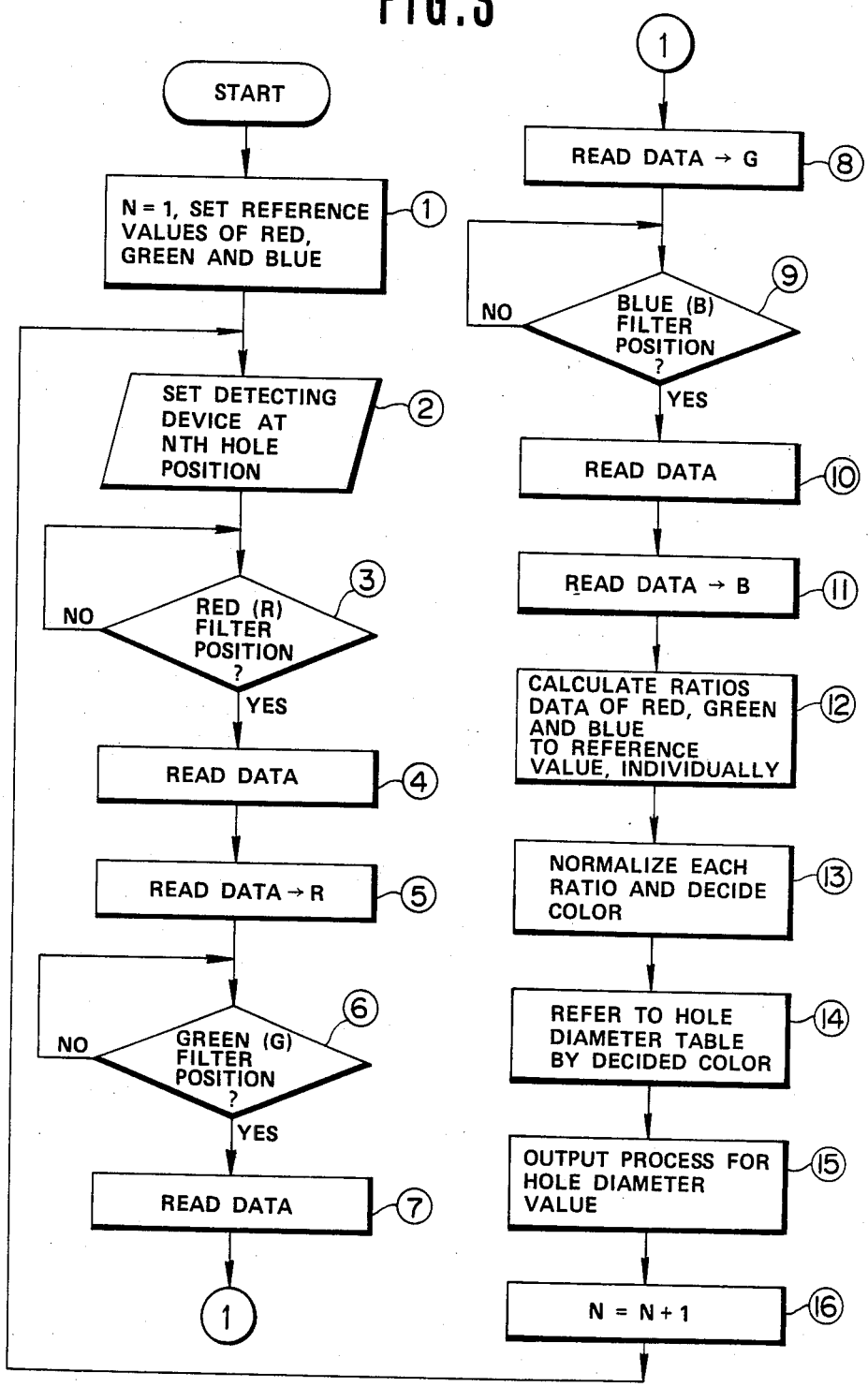
FIG. 3 is a flow chart of the process performed by the processing unit shown in FIG. 1.
Figure 4:
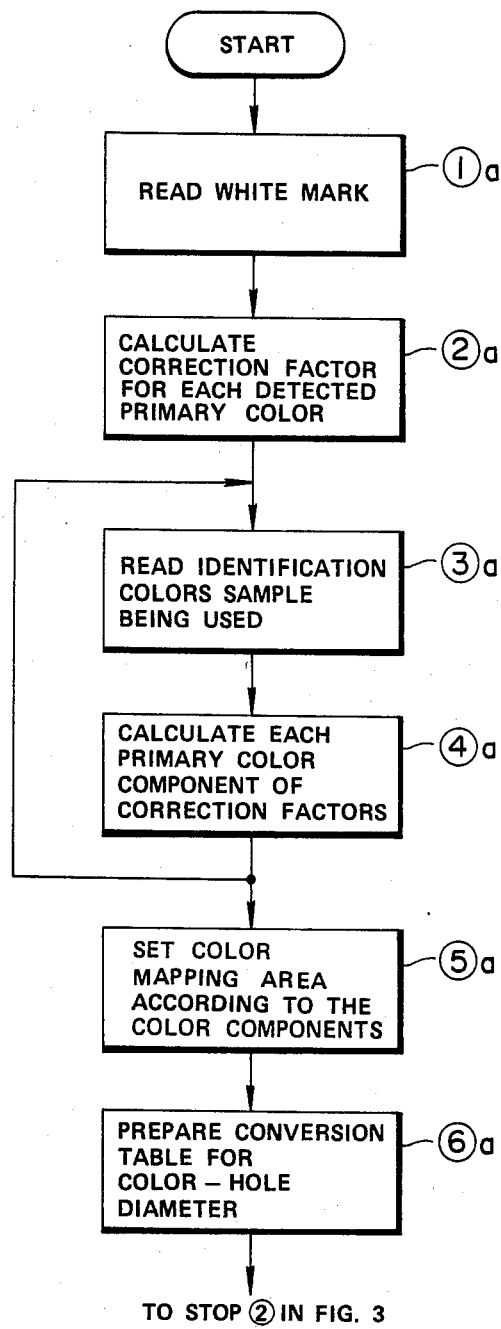
FIG. 4 is a flow chart explaining another example of the process around step 1 of FIG. 3.

FIG. 4 shows another example of the setting of the reference values in step ① and the decision of the identification color mark 3 by setting the color-hole diameter conversion table as a color mapping area in step ⑭ in FIG. 3.

In step ①a, an identification color mark 3, in a white portion is read, and in step ②a correction factors KR, KG and KB for red, green and blue, respectively, are obtained. The correction factors KR, KG and KB are calculated from the following equations, based on detection signals VR, VG and VB, such that when the white identification color mark 3 is read, the signals for the three colors of red (R), green (G) and blue (B) assume the same detection value. The detection signals VR, VG and VB are normalized or corrected by the correction factors KR, KG and KB, respectively, to have the same detection value:

$$VR \cdot KR = \tfrac{1}{3}$$

$$VG \cdot KG = \tfrac{1}{3}$$

$$VB \cdot KB = \tfrac{1}{3}$$

The calculated correction factors KB, KG and KB are stored in a predetermined portion of the memory and the processing proceeds to the next step ③a, where reading of a certain color sample, used in correspondence to a hole diameter, is performed. In step ④a, considering the correction factors KR, KG and KB, and based on the detection signals VR, VG and VB with respect to the color sample, normalized color components VRn, VGn and VBn of red (R), green (G) and blue (B) are obtained from the following equations:

$$VRn = VR \cdot KG/(VR \cdot KR + VG \cdot KG + VB \cdot KB)$$

$$VGn = VG \cdot KG/(VR \cdot KR + VG \cdot KG + VB \cdot KB)$$

$$VBn = VB \cdot KB/(VR \cdot KR + VG \cdot KG + VB \cdot KB)$$

The color components are stored in the memory in correspondence to the color sample. Thereafter, again, step ③a is repeated, and the next color sample corresponding to the next hole diameter is read. Then, in step ④a, similarly, normalized color components VRn, VGn and VBn are obtained.

In this manner, and after the color components VRn, VGn and VBn are obtained for each color sample and stored in the memory, step ⑤a, is performed. In step 5 a area information for each color is calculated and a color mapping area, according to each color sample, is set.

Next, in step ⑥a, in correspondence to the set color area, a hole diameter if generated, corresponding to each color, and a color-hole diameter conversion table is prepared. Then, the processing of step ② is initiated and the steps following thereto as set forth in FIG. 3.

By processing in such a manner, the setting of the reference value for each of the colors in step ①, and the preparation of the color-hole diameter conversion table in step ⑭ in FIG. 3 can be achieved. Furthermore, for the purpose of inputting such information, for example, a keyboard is connected to the hole diameter information generating unit 6 in FIG. 1 through its interface circuit.

In addition, with regard to the calculation of the ratios to the reference values in step ⑫ and the normalization of each ratio and the decision of the color in step ⑬ in FIG. 3, in this case, the color components VRn, VGn and VBn of the identification color mark 3 then detected are obtained in accordance with the aforementioned equations of the color components VRn, VGn and VBn, and the color is decided referring to each color area calculated in step ⑤a mentioned above. Thus, in the case of the process shown in FIG. 4, such a color decision process is the substitute or equivalent for steps ⑫, ⑬ and ⑭ in FIG. 3.

As described in the preceding, and according hereto, each holing position is set in the memory beforehand, and an indentification color mark is coated at a position on the film corresponding to this holing position, and the detecting device is positioned at this holing position, and the identification color mark is read sequentially. However, these steps may be changed such that the holing position is read on the film, and thereafter or at the same time, the hole diameter information via each color mark is read. In this case, it is preferred that a mark indicating the hole position and the identification color mark be drawn on the film simultaneously or these marks be displayed by switching therebetween.

Further, in such a case, a number of detectors may be arranged in parallel with one another to read the identification color marks 3.

In the embodiment described herein, description is made as to an example in which a pattern on the printed board is drawn on the film. However, the pattern on the film is naturally applicable to various kinds of patterns of an IC pattern and the like without being limited to the printed board. Hence, the present invention is applicable to a pattern for a so-called printed board or the like. Further, such a pattern corresponding to the printed board and the like is not limited to that drawn on the film. In addition, the pattern on the film may be either on a negative or on a positive.

Further, in the described embodiment, the positioning unit is provided so that the detecting device is positioned automatically at each position. However, since this positioning at the hole position only requires the detecting device to be positioned above the identification color mark, the positioning may also be performed by simply and efficiently manually viewing the identification mark. For this reason, the manner of positioning is not an essential feature of the present invention. Further, the positioning unit may be built into the hole diameter information generating unit, as a part thereof.

Furthermore, although the detecting device produces a detection signal corresponding to a color of the identification mark by the use of the color filter, the detecting device is not limited to that which uses such a color filter. Indeed any detecting device may be used, so long as a signal corresponding to a color for each identification color mark is obtained.

In this respect, the process in step ② in FIG. 3 is one concrete example of the positioning processing means 61 for the detecting device of FIG. 2. Likewise, the process in steps ③ to ⑬ is but one example of the decision processing means 62 for color identification. Further, the process in steps ⑭ to ⑯ is but one example of the conversion processing means 63 for color information-hole diameter information.

Still further, the figure on the film 2 in FIG. 2 is one example of a pattern figure having a plurality of marks located respectively, corresponding to holing positions of a printed board and the like and indicated by identification colors, respectively, corresponding to hole diameters. The detecting device 4 and A/D converter 5 are, in combination, only one example of a detecting means in the present invention for generating a detection signal corresponding to an identification color of the mark in the pattern figure. Further, the hole diameter information generating unit 6 is an example of a hole diameter information generating means in the present invention, which means, responsive to the signal from the detecting means, generates information representing hole diameter by deciding the color identification.

Having, thus, described the invention, what is claimed is:

1. A system for generating hole diameter information of each holing position on a printed board comprising;
   a pattern figure having a plurality of marks, the location of the marks corresponding to the holing positions for a printed board, each mark being indicated by an identification color representing a predetermined hole diameter;

detecting means for generating a detection signal containing color information of the identification color of one of each of the plurality of marks; and hole diameter information generating means including positioning means for sequentially positioning the detecting means at a position corresponding to one of the plurality of marks, the hole diameter information generating means further including hole diameter determining means responsive to the detection signals from said detecting means for determining the identification color of the mark and for converting the determined identification color into a hole diameter based on a predetermined color information-hole diameter table.

2. The system according to claim 1, wherein:

the detecting means includes a light source for applying light to one of the plurality of marks and a photo detector for receiving reflected light from the mark;

the detecting means including filters for the three primary colors and generating detection signals corresponding to the three primary colors.

3. The system according to claim 2 wherein:

the hole diameter information generating means determines the color of the mark in accordance with each component ratio of each color component represented by each detection signal corresponding to one of the primary colors detected by said detecting means to a reference valve obtained by a detection signal of a white identification mark through one of the three primary color filters of the same primary color.

4. The system according to claim 1, wherein:

the detecting means includes (1) a light source for applying light to one of the marks; (2) filters of the three primary colors, the filters of the three primary colors being rotatably driven by a motor and each generates a signal, each signal corresponding to one of the filter positions; and (3) a photo detector for receiving reflected light from the marks, the photodetector generating analog detection signals in response to the reflected light received through the filters; and the hole diameter information generating means includes (1) a positioning mechanism for sequentially positioning said detecting means at the position of one of the plurality of marks, (2) and A/D converter, and (3) a data processing unit, and further wherein the detecting means is positioned at a predetermined mark position by the positioning mechanism, and the detection signals of the three primary colors are represented, respectively, by digital values by means of the A/D converter and applied to the processing unit, the color being decided in accordance with component ratios of the primary colors by the processing unit.

5. The system according to claim 4 further including:

means for inputting correction values to the processing unit to normalize the detection signals from a means for detecting a white identification color mark so that each component of the three primary colors obtained by the detecting means is equal to one another, the detection signals of the three primary colors of one of the marks are normalized by the correction values, and the color of the mark is determined in accordance with each component ratio.

6. The system according to claim 4 wherein:

the processor includes means for normalizing by correction valve the color information detected by the detecting means from the color samples, each color sample corresponding to one of the hole diameters, and the processing unit storing a memory table of the colors in accordance with each component ratio for the detection color and processes the component ratios into hole diameter information by referring to the memory table.

* * * * *